US007876172B2

(12) United States Patent
Mori et al.

(10) Patent No.: US 7,876,172 B2
(45) Date of Patent: Jan. 25, 2011

(54) BALANCED-UNBALANCED CONVERSION ELEMENT

(75) Inventors: Hirotsugu Mori, Yasu (JP); Motoharu Hiroshima, Nomi (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 0 days.

(21) Appl. No.: 12/644,467

(22) Filed: Dec. 22, 2009

(65) Prior Publication Data

US 2010/0141351 A1 Jun. 10, 2010

Related U.S. Application Data

(63) Continuation of application No. PCT/JP2008/059432, filed on May 22, 2008.

(30) Foreign Application Priority Data

Jul. 13, 2007 (JP) ............................ 2007-183823

(51) Int. Cl.
*H03H 7/42* (2006.01)
*H01P 3/08* (2006.01)

(52) U.S. Cl. ........................................ 333/26; 333/204

(58) Field of Classification Search .................. 333/25, 333/26, 204

See application file for complete search history.

(56) References Cited

U.S. PATENT DOCUMENTS

| | | | |
|---|---|---|---|
| 6,150,897 A | 11/2000 | Nishikawa et al. | |
| 7,567,143 B2 | 7/2009 | Mori et al. | |
| 2010/0090776 A1* | 4/2010 | Mori et al. | 333/26 |

FOREIGN PATENT DOCUMENTS

| | | |
|---|---|---|
| JP | 10-290107 | 10/1998 |
| JP | 2004-350143 | 12/2004 |
| WO | WO 2008/041398 | 4/2008 |

OTHER PUBLICATIONS

PCT/JP2008/059432 Written Opinion dated Jun. 5, 2008.

* cited by examiner

*Primary Examiner*—Dean O Takaoka
(74) *Attorney, Agent, or Firm*—Dickstein Shapiro LLP

(57) ABSTRACT

A balanced-unbalanced conversion element for realizing easy adjustment of a phase balance of two balanced signals is provided. The balanced-unbalanced conversion element includes a first ¼-wavelength resonant line coupled to a first balanced terminal, a second ¼-wavelength resonant line coupled to a second balanced terminal, and a ½-wavelength resonant line. The ½-wavelength resonant line includes a first open-end-side line coupled to an unbalanced terminal and the first ¼-wavelength resonator and a second open-end-side line coupled to the second ¼-wavelength resonator. In addition, a width of the first open-end-side line differs from a width of the second open-end-side line.

8 Claims, 4 Drawing Sheets

BALANCED-UNBALANCED CONVERSION ELEMENT

CROSS REFERENCE TO RELATED APPLICATIONS

The present application is a continuation of International Application No. PCT/JP2008/059432, filed May 22, 2008, and claims priority to Japanese Patent Application No. JP2007-183823, filed Jul. 13, 2007, the entire contents of each of these applications being incorporated herein by reference in their entirety.

FIELD OF THE INVENTION

The present invention relates to a balanced-unbalanced conversion element including balanced terminals and an unbalanced terminal.

BACKGROUND OF THE INVENTION

A balanced-unbalanced conversion element that has one ½-wavelength resonator and two ¼-wavelength resonators formed on a dielectric substrate and performs balanced-unbalanced conversion has been suggested (see, for example, Patent Document 1).

FIG. 1 shows a configuration of a balun serving as a balanced-unbalanced conversion element according to the related art. A balun 101 is formed of a plurality of laminated dielectric substrates. This balun 101 has a ground electrode (not shown) on each of an upper lateral surface A and a lower lateral surface B, an unbalanced terminal (not shown) on a left lateral surface C, and two balanced terminals (not shown) on a right lateral surface D. On an illustrated upper surface of a substrate 105, an unbalanced pattern 102 is formed. The unbalanced pattern 102 is an electrode that constitutes a ½-wavelength resonator. A balanced pattern 103A and a balanced pattern 103B are formed on a dielectric substrate that is laminated on a back surface of this dielectric substrate 105. The balanced pattern 103A and the balanced pattern 1033 are electrodes that constitute different ¼-wavelength resonators.

The unbalanced pattern 102 is a substantially U-shaped electrode including parallel line portions 102A and 102B, a line portion 102C for connecting the line portions 102A and 102B, an lead electrode 102D to be connected to the ground electrode, and an lead electrode 102E to be coupled to the unbalanced terminal. Each of the balanced patterns 103A and 103B is a substantially I-shaped electrode pattern. The line portions 102A and 102B of the unbalanced pattern 102 face the balanced pattern 103A and the balanced pattern 103B through a first dielectric substrate, respectively.

In response to input of an unbalanced signal to the unbalanced terminal, this balun 101 converts the unbalanced signal into balanced signals and outputs a first balanced signal from one of the balanced terminals and a second balanced signal having a substantially opposite phase of the first balanced signal from the other balanced terminal.

Conversely, in response to input of balanced signals to the two balanced terminals, the balun converts the balanced signals into an unbalanced signal and outputs the unbalanced signal from the unbalanced terminal.

[Patent Document 1] Japanese Unexamined Patent Application Publication No. 10-290107

In general, a balance characteristic of a balanced-unbalanced conversion element is evaluated by a width of a frequency band in which a phase difference and an amplitude difference of two balanced signals converge to a predetermined range.

However, since a shape of the unbalanced pattern 102 and arrangement of the balanced patterns 103A and 103B are asymmetric in the balun 101 according to the related art, a frequency band that gives an appropriate balance characteristic is undesirably narrow.

SUMMARY OF THE INVENTION

Accordingly, an object of the present invention is to provide a balanced-unbalanced conversion element that gives an appropriate balance characteristic over a wide frequency band by setting of a shape of an unbalanced pattern.

A balanced-unbalanced conversion element of this invention includes a first ¼-wavelength resonant line, a second ¼-wavelength resonant line, and a ½-wavelength resonant line on an upper surface of a dielectric substrate. The first ¼-wavelength resonant line is coupled to a first balanced terminal. The second ¼-wavelength resonant line is coupled to a second balanced terminal. The ½-wavelength resonant line has a first open-end-side line and a second open-end-side line and constitutes a ½-wavelength resonator. The first open-end-side line is coupled to an unbalanced terminal and a first ¼-wavelength resonator. The second open-end-side line is coupled to a second ¼-wavelength resonator.

If a shape of an electrode pattern is asymmetric in a balanced-unbalanced conversion element, an electromagnetic field distribution of the balanced-unbalanced conversion element also becomes asymmetric and a frequency band giving an appropriate balance characteristic becomes narrow. In this configuration, since the unbalanced terminal is not coupled to the second open-end-side line but is coupled only to the first open-end-side line, asymmetry is caused in the electromagnetic field distribution.

Accordingly, in this invention, a gap between the first open-end-side line and the first ¼-wavelength resonant line is set to be different from a gap between the second open-end-side line and the second ¼-wavelength resonant line. The gaps of the lines make capacitance values between the respective lines asymmetric. The degree of coupling between respective resonators also becomes asymmetric. By appropriately adjusting a balance of these line gaps, asymmetry of the electromagnetic field distribution can be corrected. Accordingly, the balanced-unbalanced conversion element can provide two balanced signals whose phase difference and amplitude difference converge to a predetermined range over a wide frequency band by appropriately balancing the phase difference and the amplitude difference of the two balanced signals of the balanced-unbalanced conversion element.

Additionally, in this invention, a width of the first open-end-side line is set to be different from a width of the second open-end-side line. These line widths allow the ½-wavelength resonant line to have a step structure and the resonator length changes. In accordance with this change, a position of an equivalent short-circuited end of the ½-wavelength resonant line changes. By appropriately balancing each line width, asymmetry of the electromagnetic field distribution can be corrected. Accordingly, the balanced-unbalanced conversion element can provide two balanced signals whose phase difference and amplitude difference converge to a predetermined range over a wide frequency band by appropriately balancing the phase difference and the amplitude difference of the two balanced signals of the balanced-unbalanced conversion element.

A balance-characteristic adjusting electrode whose distal end faces a side of the ½-wavelength resonant line and whose proximal end is connected to a ground electrode may be further included. By providing the balance-characteristic adjusting electrode, capacitance is provided at the side of the ½-wavelength resonant line and this capacitance changes a position of an equivalent short-circuited end. By appropriately setting the magnitude and position of the capacitance provided by the balance-characteristic adjusting electrode, asymmetry of the electromagnetic field distribution can be corrected. Accordingly, the balanced-unbalanced conversion element can provide two balanced signals whose phase difference and amplitude difference converge to a predetermined range over a wide frequency band by appropriately balancing the phase difference and the amplitude difference of the two balanced signals of the balanced-unbalanced conversion element.

A balanced-unbalanced conversion element according to this invention can provide two balanced signals having opposite phases over a wide frequency band by appropriately setting a phase difference and an amplitude difference of the two balanced signals.

REFERENCE NUMERALS

1 balanced-unbalanced conversion element
2A, 2B glass layer
10 dielectric substrate
11A-11C short-circuit lateral electrode
12A-12C lead lateral electrode
13A, 13B, 14 resonant line
14A-14C line portion
15 ground electrode
16C unbalanced electrode
16A, 16B balanced electrode
17 lead electrode
19 balance-characteristic adjusting electrode

DETAILED DESCRIPTION OF THE INVENTION

Figure 1:
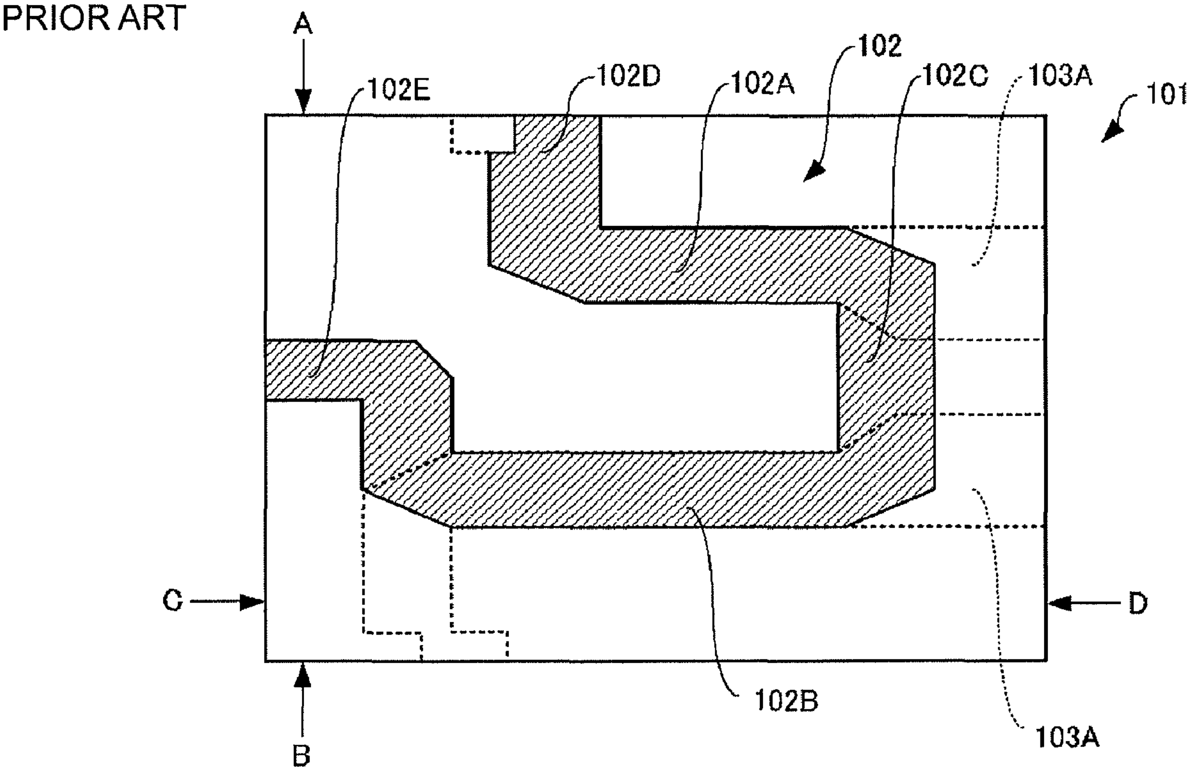
FIG. 1 PRIOR ART
FIG. 1 is a diagram illustrating a balanced-unbalanced conversion element according to the related art.
Figure 2A:
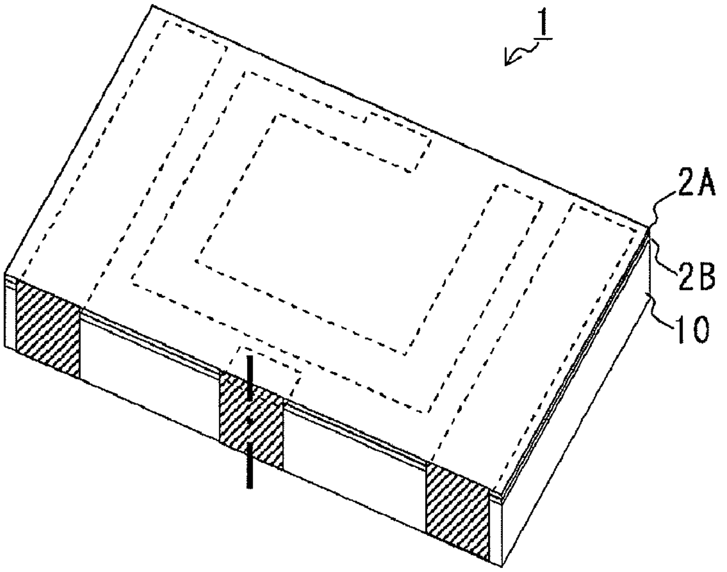
FIGS. 2(A) to 2(C) are perspective views illustrating an example of a configuration of a balanced-unbalanced conversion element.
Figure 2B:
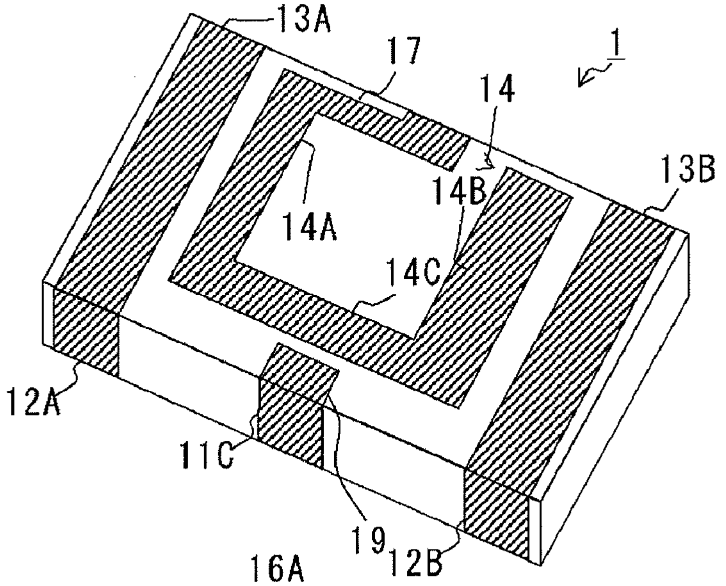
Figure 2C:
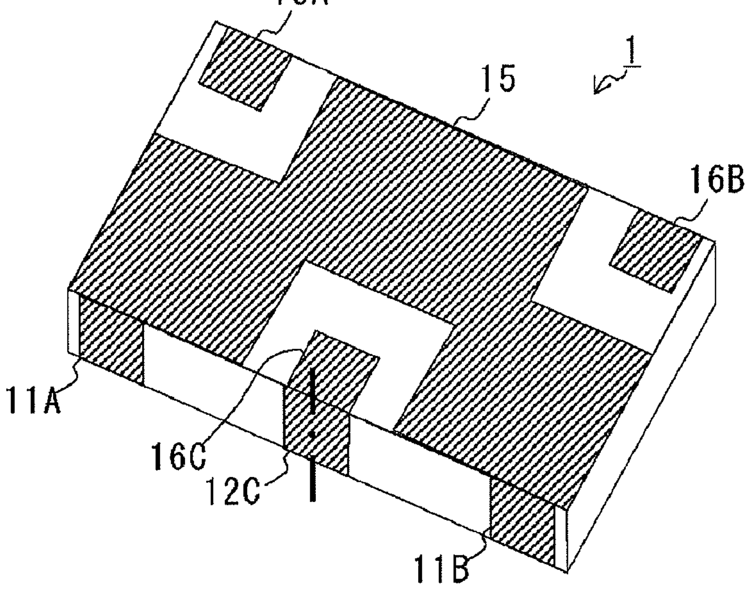

FIGS. 2(A) to 2(C) are diagrams illustrating a configuration of a balanced-unbalanced conversion element. More specifically, FIG. 2(A) is a perspective view of an upper-surface side of the balanced-unbalanced conversion element. A left proximal-side surface in the drawing corresponds to a front-side surface of the balanced-unbalanced conversion element, whereas a right proximal-side surface in the drawing corresponds to a right lateral-side surface of the balanced-unbalanced conversion element.

A balanced-unbalanced conversion element 1 is a small rectangular parallelepiped balun element for use in ultra wide band (UWB) communication. An upper surface of a rectangular flat-plate dielectric substrate 10 of this balanced-unbalanced conversion element 1 is covered with glass layers 2A and 2B. The glass layer 2B is a light-transmissive glass layer, whereas the glass layer 2A is a light-shielding glass layer.

Thickness of the dielectric substrate 10 is 500 μm, whereas thickness of each of the glass layers 2A and 2B is 15 μm. The balanced-unbalanced conversion element 1 is in the front-surface to back-surface size of approximately 2.5 mm, the right-lateral-surface to left-lateral-surface size of approximately 2.0 mm, and the upper-surface to lower-surface size of approximately 0.56 mm.

The dielectric substrate 10 is formed of a ceramic dielectric, such as titanium oxide, and is a substrate having a relative dielectric constant of approximately 110. The glass layers 2A and 2B are formed by screen printing and burning of glass paste composed of an insulator, such as crystalline $SiO_2$ or borosilicate glass.

The light-transmissive glass layer 2B is provided to be in contact with the dielectric substrate 10. The light-transmissive glass layer 2B demonstrates high adhesion strength onto the dielectric substrate 10 and prevents a circuit pattern formed on the dielectric substrate 10 from peeling off to increase environment resistance of the balanced-unbalanced conversion element 1.

The light-shielding glass layer 2A is formed by laminating an inorganic-pigment containing glass layer on the light-transmissive glass layer 2B. The light-transmissive glass layer 2A allows printing to be performed on a surface of the balanced-unbalanced conversion element 1 and realizes security protection of an internal circuit pattern.

The glass layer does not have to have a two-layer structure and may have a single-layer structure. Additionally, the glass layer may be omitted. The composition and the size of each of the dielectric substrate 10 and the glass layers 2A and 2B may be appropriately set in consideration of the degree of adhesion of the dielectric substrate 10 and the glass layers 2A and 2B, the environment resistance, and the frequency characteristic.

Depending on a printing condition employed at the time of printing of lateral electrodes described later, electrode paste may protrude on the upper surface of the balanced-unbalanced conversion element 1, namely, on the upper surface of the glass layer 2A. Since the glass layers 2A and 2B are laminated on the upper surface of the dielectric substrate 10, it is possible to prevent a part of a resonant line that does not have to be connected from being short-circuited even if the electrode protrudes. Although the lateral electrodes may protrude on the lower surface of the balanced-unbalanced conversion element 1 at the time of printing of the electrodes, this state is not problematic since the electrodes protruding to the lower surface are integrated into a ground electrode 15, balanced terminals 16A and 16B, and an unbalanced terminal 16C.

FIG. 2(B) is a perspective view of an upper-surface side of the dielectric substrate 10.

Resonant lines 13A, 13B, and 14, a lead electrode 17, and a balance-characteristic adjusting electrode 19 are provided on the upper surface of the dielectric substrate 10. The resonant line 13B corresponds to a second ¼-wavelength resonant line of the present invention. Additionally, the resonant line 13A corresponds to a first ¼-wavelength resonant line of the present invention. These electrodes are formed to be silver electrodes in the thickness of approximately 6 μm through a photolithography process and a burning process.

The resonant line 13A is in a rectangular shape extending in parallel to the left lateral surface. The resonant line 13A is provided at a position that is apart from the left lateral surface of the dielectric substrate 10 by a predetermined interval. The resonant line 13A is linked to a lead lateral electrode 12A on the front-surface side of the dielectric substrate 10 and is linked to a short-circuit lateral electrode 11A on the back-surface side of the dielectric substrate 10.

The resonant line 13B is in a rectangular shape extending in parallel to the right lateral surface. The resonant line 13B is provided at a position that is apart from the right lateral surface of the dielectric substrate 10 by a predetermined interval. The resonant line 13B is linked to a lead lateral electrode 12B on the front-surface side of the dielectric substrate 10 and is linked to a short-circuit lateral electrode 11B on the back-surface side of the dielectric substrate 10.

The resonant line 14 includes a line portion 14A, a line portion 14B, and a line portion 14C. The resonant line 14 corresponds to a ½-wavelength resonant line of the present invention. The line portion 14A corresponds to a first open-end-side line of the present invention, whereas the line portion 14B corresponds to a second open-end-side line of the present invention. The line portion 14A is parallel to the resonant line 13A. The line portion 14B is parallel to the resonant line 13B. The line portion 14C extends in parallel to the front surface of the dielectric substrate 10 and connects the line portion 14A and the line portion 14B. The line portion 14C is provided at a position that is apart from the front surface by a predetermined interval. A back-surface-side end of the line portion 14B is terminated. The line portion 14A is linked to the lead electrode 17 on the back-surface side. Since the resonant line 14 has a curved shape due to the line portions 14A-14C, a ½-wavelength resonator having a long resonator length can be formed in a limited substrate area.

The lead electrode 17 extends along the back surface of the dielectric substrate 10. The lead electrode 17 is provided at a position that is apart from the back surface by a predetermined interval. One end of the lead electrode 17 is linked to the resonant line 14, whereas the other end is linked to a lead lateral electrode 12C on the back-surface side of the dielectric substrate.

The balance-characteristic adjusting electrode 19 is an electrode provided along the front surface of the dielectric substrate 10. One end thereof is linked to a short-circuit lateral electrode 11C, whereas the other end thereof is terminated at a position near the line portion 14C.

The lead lateral electrodes 12A and 12B and the short-circuit lateral electrode 11C are provided on the front surface of the dielectric substrate 10. These electrodes are formed to be silver electrodes in the thickness of approximately 15 μm through a screen printing process and a burning process. Each lateral electrode is formed not only on the front surface of the dielectric substrate 10 but also on the front surfaces of the glass layers 2A and 2B.

The lead lateral electrode 12A is a rectangular electrode extending apart from the left lateral surface of the dielectric substrate 10 by a predetermined interval, is linked to the resonant line 13A on the upper-surface side of the dielectric substrate 10, and is linked to the balanced terminal 16A on the lower-surface side of the dielectric substrate 10.

The lead lateral electrode 12B is a rectangular electrode extending apart from the right lateral surface of the dielectric substrate 10 by a predetermined interval, is linked to the resonant line 13B on the upper-surface side of the dielectric substrate 10, and is linked to a balanced terminal 16B on the lower-surface side of the dielectric substrate 10.

The center of a width of the short-circuit lateral electrode 11C matches the center of the front surface of the dielectric substrate 10 (represented by a dotted-chain line in the drawing). The short-circuit lateral electrode is a rectangular electrode extending from the lower-surface side to the upper-surface side, is linked to the balance-characteristic adjusting electrode 19 on the upper-surface side of the dielectric substrate 10, and is linked to a ground electrode 15 on the lower-surface side of the dielectric substrate 10.

FIG. 2C is a perspective view of a lower-surface side of the dielectric substrate 10. A left proximal surface in the drawing corresponds to the back surface of the balanced-unbalanced conversion element 1, whereas a right proximal surface in the drawing corresponds to the right lateral surface of the balanced-unbalanced conversion element 1.

The ground electrode 15, the balanced terminals 16A and 16B, and the unbalanced terminal 16C are provided on the lower surface of the dielectric substrate 10. These electrodes are formed to be silver electrodes in the thickness of approximately 15 μl through a screen printing process and a burning process.

The balanced terminal 16A is a rectangular electrode provided on the front-surface and left-lateral-surface side of the dielectric substrate 10 and is connected to one of input/output terminals of a balanced signal when the balanced-unbalanced conversion element 1 is mounted on a mounting board. The balanced terminal 16A is linked to the lead lateral electrode 12A on the front-surface side of the dielectric substrate 10.

The balanced terminal 16B is a rectangular electrode provided on the front-surface and right-lateral-surface side of the dielectric substrate 10 and is connected to the other input/output terminal of a balanced signal when the balanced-unbalanced conversion element 1 is mounted on a mounting board. The balanced terminal 16B is linked to the lead lateral electrode 12B on the front-surface side of the dielectric substrate 10.

The unbalanced terminal 16C is a rectangular electrode provided at the center of the back surface of the dielectric substrate 10 and is connected to an input/output terminal of an unbalanced signal when the balanced-unbalanced conversion element 1 is mounted on a mounting board. The unbalanced terminal 16C is linked to the lead lateral electrode 12C on the back-surface side of the dielectric substrate 10.

The ground electrode 15 is a ground electrode of a stripline resonator that is provided substantially on the whole lower surface of the dielectric substrate 10 excluding areas near the balanced terminals 16A and 16B and the unbalanced terminal 16C and also serves as an electrode for mounting the balanced-unbalanced conversion element 1 on a mounting board. The ground electrode 15 is linked to the short-circuit lateral electrode 11C at the center of the front-surface side of the dielectric substrate 10, is linked to the short-circuit lateral electrode 11A on the back-surface and left-lateral-surface side of the dielectric substrate 10, and is linked to the short-circuit lateral electrode 11B on the back-surface and right-lateral-surface side of the dielectric substrate 10. This ground electrode 15 faces the resonant line 14 but does not face the lead electrode 17. Accordingly, back-surface-side ends of the line portion 14A and the line portion 14B of the resonant line 14 are open ends of the resonant line 14.

The lead lateral electrode 12C and the short-circuit lateral electrodes 11A and 11B are provided on the back surface of the dielectric substrate 10. These electrodes are formed to be silver electrodes in the thickness of approximately 15 μl through a screen printing process and a burning process. Each lateral electrode is formed not only on the back surface of the dielectric substrate 10 but also on the back surfaces of the glass layers 2A and 2B.

The short-circuit lateral electrode 11A is a rectangular electrode extending apart from the left lateral surface of the dielectric substrate 10 by a predetermined interval, is linked to the resonant line 13A on the upper-surface side of the dielectric substrate 10, and is linked to the ground electrode 15 on the lower-surface side of the dielectric substrate 10.

The short-circuit lateral electrode 11B is a rectangular electrode extending apart from the right lateral surface of the dielectric substrate 10 by a predetermined interval, is linked to the resonant line 13B on the upper-surface side of the dielectric substrate 10, and is linked to the ground electrode 15 on the lower-surface side of the dielectric substrate 10.

The center of a width of the lead lateral electrode 12C matches the center of the back surface of the dielectric substrate 10 (represented by a dotted-chain line in the drawing). The lead lateral electrode is a rectangular electrode extending from the lower-surface side to the upper-surface side, is linked to the lead electrode 17 on the upper-surface side of the dielectric substrate 10, and is linked to the unbalanced terminal 16C on the lower-surface side of the dielectric substrate 10.

The short-circuit lateral electrodes 11A-11C and the lead lateral electrodes 12A-12C have the same line width. The resonant lines 13A and 13B also have the same line width. Preferably, these line widths are adjusted to realize a frequency characteristic of each resonator needed by the balanced-unbalanced conversion element.

By configuring the balanced-unbalanced conversion element 1 in this manner, each of the resonant line 13A and the resonant line 13B constitutes a ¼-wavelength resonator, one end of which is opened and the other end of which is short-circuited, along with the ground electrode 15. The resonant line 14 constitutes a ½-wavelength resonator, both ends of which are opened, along with the ground electrode 15. The ¼-wavelength resonator and the ½-wavelength resonator including the resonant line 13A and the resonant line 14, respectively, are interdigitally-coupled. The ¼-wavelength resonator and the ½-wavelength resonator including the resonant line 13B and the resonant line 14, respectively, are interdigitally-coupled. The ¼-wavelength resonator including the resonant line 13A is tap-coupled to the balanced terminal 16A. The ¼-wavelength resonator including the resonant line 13B is tap-coupled to the balanced terminal 16B. The ½-wavelength resonator including the resonant line 14 is tap-coupled to the unbalanced terminal 16C.

Accordingly, this balanced-unbalanced conversion element 1 converts balanced signals input to the balanced terminals 16A and 16B into an unbalanced signal and outputs the unbalanced signal from the unbalanced terminal 16C. The balanced-unbalanced conversion element also converts an unbalanced signal input to the unbalanced terminal 16C into balanced signals and outputs the balanced signals from the balanced terminals 16A and 16B. This balanced-unbalanced conversion element realizes a wider frequency band by firmly coupling resonant lines through interdigital coupling.

Since the thickness of the resonant lines 13A and 13B is set to be approximately 6 μm and the thickness of each lateral electrode is set to be approximately 15 μm, current that generally concentrates at the short-circuited ends of the resonant lines 13A and 13B is distributed to reduce a conductor loss. This configuration allows the balanced-unbalanced conversion element 1 to have a small insertion loss.

Additionally, each lateral electrode is formed in a congruent shape on the front surface and the back surface of the dielectric substrate 10. This eliminates the necessity of discriminating the front surface of the dielectric substrate 10 from the back surface thereof at the time of printing of each lateral electrode. Each lateral electrode can be printed without completely adjusting the direction of the dielectric substrate. Accordingly, the printing process can be simplified.

In this balanced-unbalanced conversion element 1, the asymmetric resonant line 14 is formed on the upper surface of the dielectric substrate 10. More specifically, the width of the line portion 14A is set to be different from that of the line portion 14B. The width of the line portion 14B is one and a half times as wide as that of the line portion 14A. Additionally, a gap between the line portion 14A and the resonant line 13A is set to be different from a gap between the line portion 14B and the resonant line 13B. The gap between the line portion 14B and the resonant line 13B is one and a half times as large as the gap between the line portion 14A and the resonant line 13A. A given value may be set for the width of the line portion 14C. It is assumed herein that the width of the line portion 14C is set equal to that of the line portion 14A.

Since the width of the line portion 14A is set to be different from the width of the line portion 14B, the resonant line 14 has a step structure and the line length thereof is shortened relative to the resonator length thereof. Additionally, a position of an equivalent short-circuited end is changed. By appropriately balancing the width of the line portion 14A and the width of the line portion 14B, asymmetry of an electromagnetic field distribution of the balanced-unbalanced conversion element 1 can be corrected.

Since the gap between the line portion 14A and the resonant line 13A is set to be different from the gap between the line portion 14B and the resonant line 13B, coupling capacitance between the line portion 14A and the resonant line 13A and coupling capacitance between the line portion 14B and the resonant line 13B become asymmetric. By appropriately balancing these gaps, asymmetry of the electromagnetic field distribution of the balanced-unbalanced conversion element 1 can be corrected.

In addition, since the balance-characteristic adjusting electrode 19 is provided on the front-surface side of the upper surface of the dielectric substrate 10, capacitance is generated between a part near the distal end of the balance-characteristic adjusting electrode 19 and the line portion 14C of the resonant line 14. A position of an equivalent short-circuited end of the ½-wavelength resonator including the resonant line 14 is shifted by the capacitance provided by the balance-characteristic adjusting electrode 19 from a position obtained when the balance-characteristic adjusting electrode 19 is not provided. Accordingly, the position of the equivalent short-circuited end of the ½-wavelength resonator can be adjusted by the position and magnitude of the provided capacitance and asymmetry of the electromagnetic field distribution of the balanced-unbalanced conversion element 1 can be corrected.

As described above, by correcting asymmetry of the electromagnetic field distribution, it is possible to adjust a balance characteristic of balanced signals of the balanced terminal 16A and the balanced terminal 16B and to converge a phase difference and an amplitude difference of the two balanced signals to a predetermined range over a wide frequency band.

An example of a result of a simulation experiment performed to determine a balance-characteristic adjustment effect resulting from setting of schematic shapes of the line portion 14A and the line portion 14B will be described next.

Figure 3A:
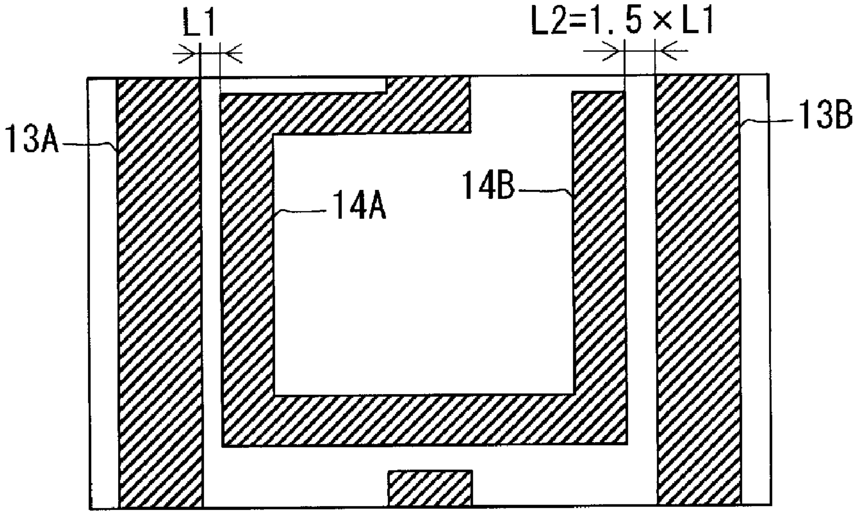
FIG. 3(A) is a schematic top view of upper-surface electrode patterns of one example of a balanced-unbalanced conversion element of the invention.

FIG. 3(A) is a schematic top view of upper-surface electrode patterns. An example of a configuration where widths of the line portion 14A and the line portion 14B are equal and a gap L2 between the line portion 14B and the resonant line 13B is approximately one and a half times as large as a gap L1 between the line portion 14A and the resonant line 13A is shown.

Figure 3B:
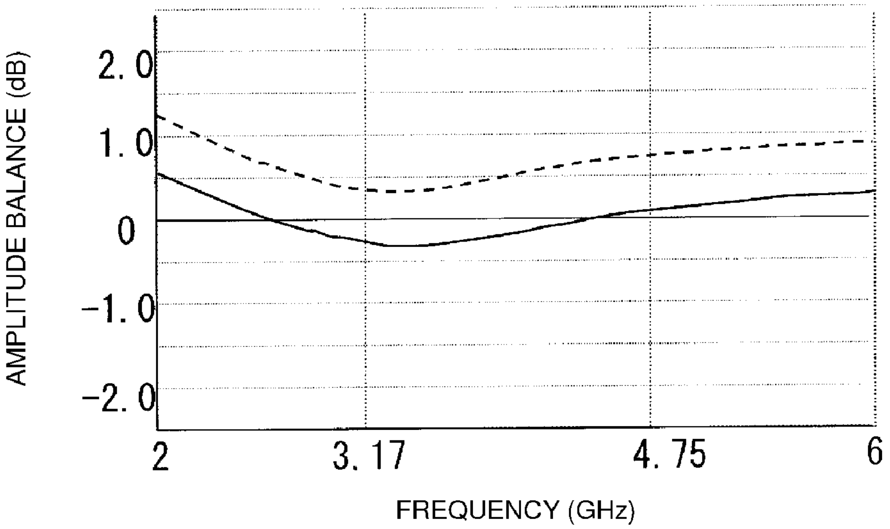
FIGS. 3(B) and 3(C) are graphs showing simulation results of the example of FIG. 3(A).

A graph shown in FIG. 3(B) illustrates a simulation result of an amplitude difference (amplitude balance) of two balanced signals resulting from line gap adjustment. The horizontal axis represents a frequency, whereas the vertical axis represents an amplitude difference between the two balanced signals.

In the drawing, a solid line indicates this configuration example that realizes leveling of the amplitude balance by adjusting the gap L2 between the line portion 14B and the resonant line 13B to be approximately one and a half times as large as the gap L1 between the line portion 14A and the resonant line 13A. In contrast, a broken line in the drawing indicates a comparative example of the amplitude balance obtained when the gap L2 between the line portion 14B and the resonant line 13B is equal to the gap L1 between the line portion 14A and the resonant line 13A.

According to the simulation result, the amplitude difference of the two balanced signals is reduced over a predetermined frequency band (in this example, 3.17 GHz-4.75 GHz) in this configuration compared to the comparative configuration and the amplitude difference can be leveled over the predetermined frequency band. In this manner, in the configuration according to this embodiment, a flat amplitude characteristic is obtained by appropriately setting the line gaps. As described above, an amplitude difference of two balanced signals of the balanced-unbalanced conversion element 1 can be leveled by setting different line gaps and two balanced signals whose amplitude difference converges to a predetermined range can be obtained over a wide frequency band.

Figure 3C:
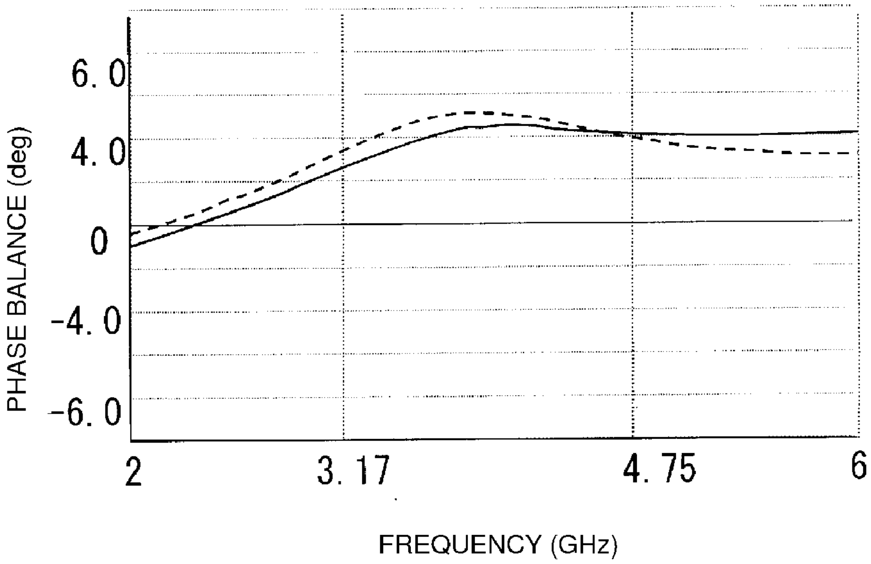

A graph shown in FIG. 3(C) illustrates a simulation result of a phase difference (phase balance) of two balanced signals resulting from line gap adjustment. The horizontal axis represents a frequency, whereas the vertical axis represents a phase difference between the two signals. A solid line in the drawing represents this configuration example. In contrast, a broken line in the drawing represents a comparative configuration example.

According to the simulation result, a phase difference of the two balanced signals is reduced over a predetermined frequency band (in this example, 3.17 GHz-4.75 GHz) in this configuration compared to the comparative configuration and the phase difference can be leveled over the predetermined frequency band. In this manner, in the configuration according to this embodiment, a flat phase characteristic is obtained by appropriately setting the line gaps. As described above, a phase difference of two balanced signals of the balanced-unbalanced conversion element 1 can be leveled by setting different line gaps and two balanced signals whose phase difference converges to a predetermined range can be obtained over a wide frequency band.

Figure 4A:
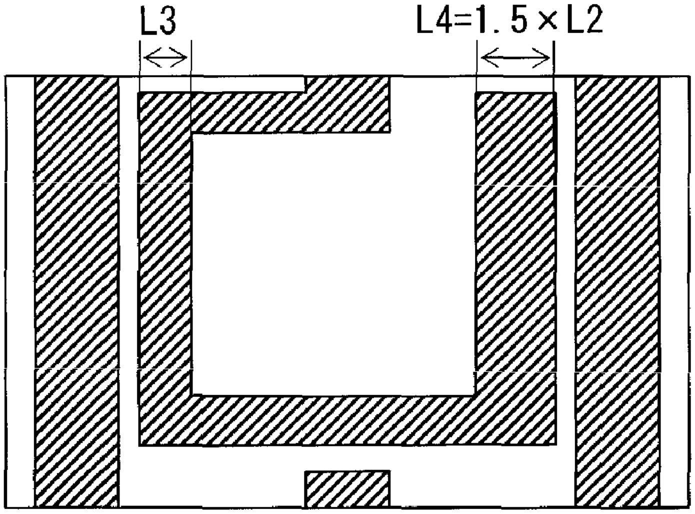
FIG. 4(A) is a schematic top view of upper-surface electrode patterns of a further example of a balanced-unbalanced conversion element of the invention.

FIG. 4(A) is a schematic top view of upper-surface electrode patterns. An example of a configuration where a gap between the line portion 14B and the resonant line 13B is equal to a gap between the line portion 14A and the resonant line 13A and a width L4 of the line portion 14B is approximately one and a half times as wide as a width L3 of the line portion 14A is shown.

Figure 4B:
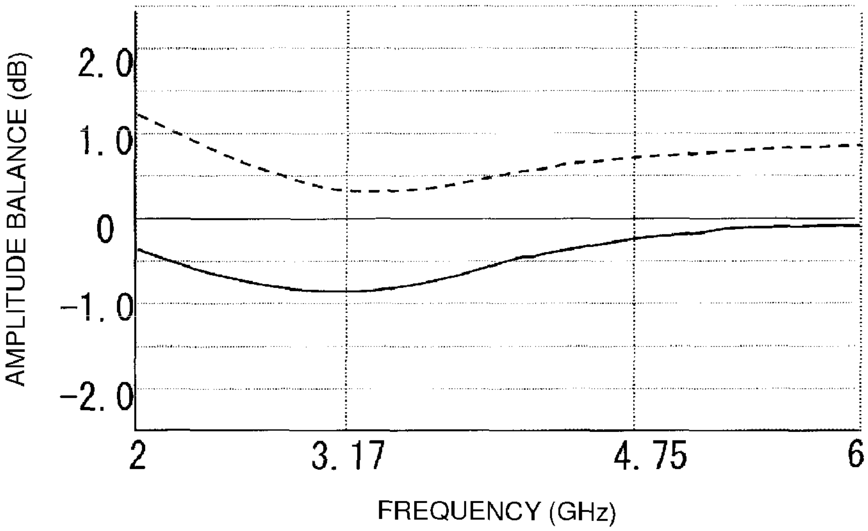
FIGS. 4(B) and 4(C) are graphs showing simulation results of the example of FIG. 4(A).

A graph shown in FIG. 4(B) illustrates a simulation result of an amplitude difference (amplitude balance) of two balanced signals resulting form line width adjustment. The horizontal axis represents a frequency, whereas the vertical axis represents an amplitude difference of the two balanced signals.

A solid line in the drawing represents this configuration example in which the amplitude balance can be leveled by adjusting the width L4 of the line portion 14B to be approximately one and a half times as wide as the width L3 of the line portion 14A. In contrast, a broken line in the drawing represents a comparative example of the amplitude balance obtained when the width L4 of the line portion 14B is equal to the width L3 of the line portion 14A.

According to the simulation result, an amplitude difference of the two balanced signals is reduced over a predetermined frequency band (in this example, 3.17 GHz-4.75 GHz) in this configuration compared to the comparative configuration and the amplitude difference can be leveled over the predetermined frequency band. In this manner, in the configuration according to this embodiment, a flat amplitude characteristic is obtained by appropriately setting the line widths. As described above, an amplitude difference of two balanced signals of the balanced-unbalanced conversion element 1 can be leveled by setting different line widths and two balanced signals whose amplitude difference converges to a predetermined range can be obtained over a wide frequency range.

Figure 4C:
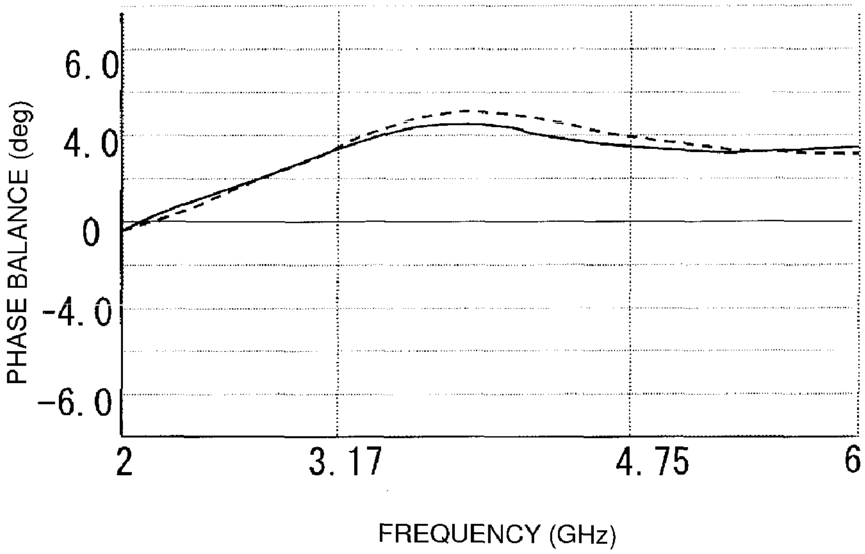

A graph shown in FIG. 4(C) illustrates a simulation result of a phase difference (phase balance) of two balanced signals resulting from line width adjustment. The horizontal axis represents a frequency, whereas the vertical axis represents a phase difference of the two balanced signals. A solid line in the drawing represents this configuration example. In contrast, a broken line in the drawing represents a comparative configuration example.

According to the simulation result, a phase difference of the two balanced signals is reduced over a predetermined frequency band (in this example, 3.17 GHz-4.75 GHz) in this configuration compared to the comparative configuration and the phase difference can be leveled over the predetermined frequency band. In this manner, in the configuration according to this embodiment, a flat phase characteristic is obtained by appropriately setting the line widths. As described above, a phase difference of two balanced signals of the balanced-unbalanced conversion element 1 can be leveled by setting different line widths and two balanced signals whose phase difference converges to a predetermined range can be obtained over a wide frequency band.

The arrangement of the resonant lines and the short-circuit lateral electrodes of the above-described configuration example is based on a product specification and may be in any form according to the product specification. The present invention can be applied to configurations other than the above-described one and can be applied to various pattern shapes of a balanced-unbalanced conversion element. Additionally, other configurations (high-frequency circuit) may be included in this balanced-unbalanced conversion element.

The invention claimed is:

1. A balanced-unbalanced conversion element comprising:

a dielectric substrate;

a first ¼-wavelength resonant line on a surface of the dielectric substrate and coupled to a first balanced terminal to form a first ¼-wavelength resonator;

a second ¼-wavelength resonant line on the surface of the dielectric substrate and coupled to a second balanced terminal to form a second ¼-wavelength resonator; and a ½-wavelength resonant line on the surface of the dielectric substrate, the ½-wavelength resonant line including a first open-end-side line coupled to an unbalanced terminal and the first ¼-wavelength resonator and a second open-end-side line coupled to the second ¼-wavelength resonator to form a ½-wavelength resonator, wherein a first gap between the first open-end-side line and the first ¼-wavelength resonant line is different from a second gap between the second open-end-side line and the second ¼-wavelength resonant line.

2. The balanced-unbalanced conversion element according to claim 1, wherein a first width of the first open-end-side line of the ½-wavelength resonant line is different from a second width of the second open-end-side line of the ½-wavelength resonant line.

3. The balanced-unbalanced conversion element according to claim 1, further comprising:

a balance-characteristic adjusting electrode having a distal end facing a side of the ½-wavelength resonant line and a proximal end connected to a ground electrode.

4. The balanced-unbalanced conversion element according to claim 2, further comprising:

a balance-characteristic adjusting electrode having a distal end facing a side of the ½-wavelength resonant line and a proximal end connected to a ground electrode.

5. The balanced-unbalanced conversion element according to claim 1, further comprising:

a lead electrode having a first end connected to the first open-end-side line and a second end connected to the unbalanced terminal.

6. A balanced-unbalanced conversion element comprising:

a dielectric substrate;

a first ¼-wavelength resonant line on a surface of the dielectric substrate and coupled to a first balanced terminal to form a first ¼-wavelength resonator;

a second ¼-wavelength resonant line on the surface of the dielectric substrate and coupled to a second balanced terminal to form a second ¼-wavelength resonator; and a ½-wavelength resonant line on the surface of the dielectric substrate, the ½-wavelength resonant line including a first open-end-side line coupled to an unbalanced terminal and the first ¼-wavelength resonator and a second open-end-side line coupled to the second ¼-wavelength resonator to form a ½-wavelength resonator, wherein a first width of the first open-end-side line is different from a second width of the second open-end-side line.

7. The balanced-unbalanced conversion element according to claim 6, further comprising:

a balance-characteristic adjusting electrode having a distal end facing a side of the ½-wavelength resonant line and a proximal end connected to a ground electrode.

8. The balanced-unbalanced conversion element according to claim 6, further comprising:

a lead electrode having a first end connected to the first open-end-side line and a second end connected to the unbalanced terminal.

* * * * *